United States Patent [19]

Kondo et al.

[11] Patent Number: 5,480,763
[45] Date of Patent: Jan. 2, 1996

[54] METHOD FOR MANUFACTURING A STAMPER FOR HIGH-DENSITY RECORDING DISCS

[75] Inventors: Tetsuya Kondo; Kei Murata, both of Yokohama; Yoshikazu Nagai, Yokosuka; Katunori Ohshima, Yokohama, all of Japan

[73] Assignee: Victor Company of Japan, Ltd., Yokohama, Japan

[21] Appl. No.: 411,075

[22] Filed: Mar. 27, 1995

Related U.S. Application Data

[60] Continuation of Ser. No. 157,244, Nov. 26, 1993, abandoned, which is a division of Ser. No. 816,895, Jan. 3, 1992, abandoned.

[30] Foreign Application Priority Data

Jan. 11, 1991  [JP]  Japan ..................... 3-13669

[51] Int. Cl.⁶ ..................................... G03F 7/00
[52] U.S. Cl. .................. 430/320; 430/321; 430/328; 430/330; 430/945; 216/24
[58] Field of Search ..................... 430/320, 321, 430/328, 330, 945; 156/659.11; 264/2.5, 107; 216/24

[56] References Cited

U.S. PATENT DOCUMENTS

| | | | |
|---|---|---|---|
| 4,104,070 | 8/1978 | Moritz et al. | 430/329 |
| 4,356,254 | 10/1982 | Takahashi et al. | 430/296 |
| 4,724,043 | 2/1988 | Bergendahl et al. | 156/643 |
| 5,025,510 | 6/1991 | Yashima | 264/300 |
| 5,073,101 | 12/1991 | Imataki et al. | 425/385 |
| 5,087,192 | 2/1992 | Kanome et al. | 425/385 |

FOREIGN PATENT DOCUMENTS

| | | |
|---|---|---|
| 0387037 | 9/1990 | European Pat. Off. . |
| 50-23453 | 3/1975 | Japan . |
| 61-26951 | 2/1986 | Japan . |
| 61-26952 | 2/1986 | Japan . |
| 1-86344 | 3/1989 | Japan . |
| 1-188332 | 7/1989 | Japan . |
| 1-205744 | 8/1989 | Japan . |
| 2-23560 | 9/1990 | Japan . |
| 2-245322 | 10/1990 | Japan . |

*Primary Examiner*—Charles L. Bowers, Jr.
*Assistant Examiner*—John A. McPherson
*Attorney, Agent, or Firm*—Lowe, Price, LeBlanc & Becker

[57] ABSTRACT

A stamper for use in producing high-density recording disks of the type in which an information signal pattern is formed as successive minute pits in a recording surface, is formed of glass and is manufactured by an image reversal photolithography process in which a film of a positive type of photoresist is scanned by a modulated light beam, baking is then executed to produce cross-linking of molecular chains within the portions of the photoresist which have been exposed to the scanning beam, and the photoresist is then subjected to overall flood exposure to light, whereby the photoresist portions which were not exposed to the scanning light beam can be removed by applying an alkaline solution. A photoresist pattern is thereby formed, to be used as an etching mask which can be patterned to a higher degree of resolution than has been possible hitherto, whereby a glass stamper for producing very high-capacity recording disks can be manufactured.

6 Claims, 3 Drawing Sheets

| PIT WIDTH | TRACK PITCH | LINEAR VELOCITY | CAPACITY | COMMENTS |
|---|---|---|---|---|
| 0.6 μm | 1.6 μm | 1.4 m/s | 640MB | CD |
| 0.3 μm | 0.8 μm | 0.7 m/s | 2560MB | FIRST EMBODIMENT |
| 0.15 μm | 0.4 μm | 0.35 m/s | 10240MB | SECOND EMBODIMENT |

5,480,763

METHOD FOR MANUFACTURING A STAMPER FOR HIGH-DENSITY RECORDING DISCS

This application is a continuation of application Ser. No. 08/157,244 filed Nov. 26, 1993, now abandoned, which is a division of application Ser. No. 07/816,895 filed Jan. 3, 1992, now abandoned.

BACKGROUND OF THE INVENTION

1. Field of Applicable Technology

The present invention relates to a stamper which is used in producing recording disks having a high density of recorded data, and to a method of manufacture of such a stamper.

2. Description of the Related Art

In recent years, technical advances have been made in the field of recording disks, and in particular in the field of optical recording disks such as CDs (compact disks). Improvements are being envisaged for such optical recording disks whereby a narrower track pitch and increased linear recording density can be achieved, so that for example it will be possible to produce long-playing CDs, or CDs which can reproduce images.

In such optical recording disks, information is recorded in the form of very small depressions, referred to as "pits" which are formed in a surface of a disk made of a plastic material, with that surface then being coated with a thin film of optically reflective material, which is then covered by a protective film. The pits, which correspond to an information signal pattern that is to be reproduced, are formed while the plastic disk is in a soft condition, by being transferred (e.g. by injection molding) from a surface of a stamper which has a pattern formed thereon which is the inverse of the pattern of pits. That is to say, for each pit which is to be formed in the recording surface of a recording disk, there is a corresponding small protrusion on the stamper surface. For clarity of description, these protrusions will be referred to in the following as the stamper protrusions, and the face of the stamper having these protrusions will be referred to as the stamper surface.

The essential factor for achieving an increased recording density of such a recording disk is to reduce both the pit length and the width dimensions. However it is difficult to achieve such a reduction, due to problems in manufacturing a stamper which will accurately form pits having a very small width. In the prior art, the stamper has in general been formed of nickel (Ni). However nickel is a relatively soft metal, and so is not ideally suited to such manufacturing process. In addition, it is essential to achieve an extremely flat surface for the stamper, and nickel is not an ideal material for achieving a highly flat surface.

Glass is harder than metal, and is also superior with regard to achieving a flat surface, and so could in principle be used to manufacture a stamper for forming high-density recording disks. Furthermore if glass were to be used as the material of a stamper, then because of the low thermal conductivity of glass, a problem of bifringence of the recording disks which occurs in the prior art could be reduced. That problem is described in Japanese Patent Application Provisional Publication 3-119534.

A method of producing a stamper formed of glass, for use in forming high-density recording discs has been described by the present applicant in Japanese Patent Application Provisional Publication 1-188332. The essential details of that method of manufacture will be summarized in the following, referring to FIG. 1. In the first step illustrated in diagram (a) of FIG. 1, a layer of negative-type photoresist 2 (i.e. a type of photoresist whereby regions which have been exposed to light can subsequently be left unchanged while other regions are removed by a solvent) is evenly coated over a highly polished upper surface of a quartz glass substrate 1. In the next step illustrated by diagram (b), a focussed laser light beam 3 which is modulated by the information signal pattern that is to be recorded is scanned over the photoresist layer 2 to thereby selectively expose successive portions of the photoresist layer 2 in accordance with the information signal pattern. Specifically, each region where a pit is to be formed on the recording disks (i.e. a protrusion is to be formed on the stamper surface) is exposed to the light beam 3. The photoresist layer 2 is then developed, i.e. the portions of that layer which have not been exposed to light are removed by dissolving in a suitable solvent, leaving the desired pattern of photoresist portions as illustrated in diagram (c). Dry etching of the substrate is then performed by a $CF_4$ gas plasma 4, with the etching being halted when a desired depth has been reached as illustrated in diagram (d). The remaining portions of photoresist 2 are then removed by an oxygen plasma to obtain the completed glass stamper, shown in diagram (e), with the protrusions 5 formed on the stamper surface. Using that stamper, disk substrates can then be formed, by a molding method in which a surface of a soft plastic layer has a pattern of pits formed therein by the pattern of stamper protrusions, the plastic then being hardened to form a disk substrate, with the disk substrate being then having a recording film (optically reflective) and a protective film formed thereon, to obtain a high-density optical recording disk.

In the following, the term "pit width" will be used to refer to the width of each stamper protrusion (i.e. the dimension as measured at right angles to a recording track direction along which stamper protrusions are successively formed), as well as to the width of the resultant pits which will be formed in a recording disk by that stamper.

In the above description, the photolithography operation to form the photoresist pattern of diagram (b) is carried out by using a negative-type photoresist, in conjunction with dry etching. However with such a method of photolithography, the minimum pit width that can be achieved is approximately 1.00 µm. Thus for example in the case of a CD, the maximum recording density is limited as a result of the relatively large size of the pit width, and it has not hitherto been possible to manufacture a stamper formed of glass which will produce a smaller pit width. This is due to the fact that even if a shorter wavelength of light is used for exposure in the photolithography process, the pit size cannot be further reduced due to the chemical characteristics of the photoresist material. Specifically, the solubility ratio of the portions of the photoresist which have been exposed to light and the portions of the photoresist which have not been exposed is small. Here, "solubility" is with respect to a solvent that is used to remove the portions of the photoresist which have not been exposed to light, after the step described hereinabove of selectively exposing the photoresist layer to light has been completed.

SUMMARY OF THE INVENTION

It is an objective of the present invention to overcome the disadvantages of the prior art as set out above by providing a stamper for producing high-density recording discs, whereby a smaller value of pit width can be achieved than has been possible in the prior art. This is achieved by using an image reversal process whereby a film of positive type photoresist (i.e. a photoresist whereby, as normally used, those portions which have been exposed to light are subsequently removed by a solvent) is formed on a glass substrate, which is scanned by a modulated light beam, and then is baked to achieve molecular cross-linking within the portions of the photoresist which were exposed to the scanning beam. The photoresist film is then subjected to overall flood exposure to light, and the portions of the photoresist which were not exposed to the light beam can then be removed using a suitable solvent which will not dissolve the regions of cross-linked molecules, leaving a pattern of photoresist which can be used as an etching mask for forming the desired pattern of stamper protrusions on the surface of the glass plate. In the preferred embodiment, the solvent used to remove the exposed portions of the photoresist is an aqueous alkaline solution. Since the solubility ratio of the photoresist portions for which molecular cross-linking did not occur to the portions for which such cross-linking did occur is higher than the solubility ratio of a usual negative type of photoresist, a higher resolution can be obtained for the photoresist pattern than has been possible in the prior art.

More specifically according to a first aspect the present invention provides, in a stamper having a surface formed with a pattern which is the inverse of an information signal pattern consisting of successive pits, for use in transferring said information signal pattern to a layer of soft plastic material which is subsequently hardened to form a recording disk, the improvement whereby said stamper is formed of glass, and whereby said information signal pattern has a pit width that is in the range 0.15 µm to 1.00 µm.

According to a second aspect, the present invention provides a method of manufacturing a stamper for use in producing high-density recording disks, comprising steps of:

coating a film of photoresist over a flat surface of a glass substrate;

scanning said photoresist film with a light beam which is modulated in accordance with an information signal pattern;

executing a reverse bake operation of heating said glass substrate and photoresist film at a predetermined temperature for a predetermined time period;

subjecting said photoresist film to overall flood exposure to light;

applying an alkaline solution to remove all portions of said photoresist film other than portions which had been exposed to said light beam, to leave a photoresist film pattern corresponding to said information signal pattern;

executing etching of said surface of the glass substrate, to a predetermined depth, using said photoresist film pattern as a mask; and removing all remaining portions of said photoresist film.

DESCRIPTION OF PREFERRED EMBODIMENTS

Figure 1A:
FIG. 1 is a diagram showing successive steps in a prior art method of manufacture of a stamper for use in producing recording disks.
Figure 1B:
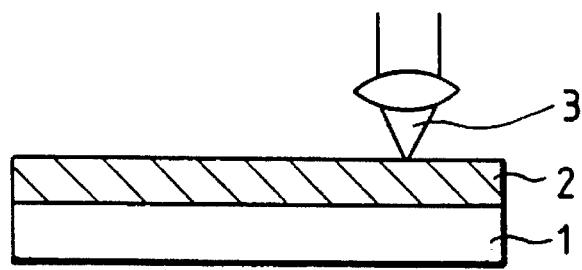
Figure 1C:
Figure 1D:
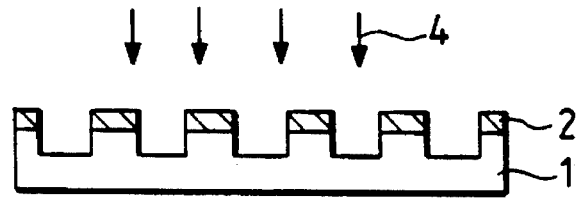
Figure 1E:

Before describing specific embodiments of the present invention, a description of the basic principles of the invention will be given. With the present invention, the prior art problem set out hereinabove of the difficulty in obtaining a sufficiently small size of pit width is overcome by using a photoresist material having a large value of solubility ratio (as defined hereinabove). A positive type of photoresist (abbreviated in the following to "posi-resist) provides a suitably high value of solubility ratio. However if a layer of posi-resist is selectively exposed by a light beam, as shown in diagram (b) of FIG. 1, then normally it will only be possible to form a pattern of concave regions of photoresist (i.e. the portions of the photoresist which have been exposed to light are removed by dissolving). Thus in order to obtain a pattern of raised protrusions on a stamper surface (by first forming a pattern of protrusions of photoresist over the respective positions at which the stamper protrusions are to be formed, as illustrated in diagram (c) of FIG. 1), using a posi-resist, it would normally be necessary to use a mask (having openings formed therein at positions where protrusions are not to be formed) disposed over the photoresist layer, and to selectively expose that photoresist layer to light that is directed overall onto the mask and the openings therein. However it is extremely difficult in practice to manufacture such a mask, due to the very high accuracy that is required.

For that reason it has been proposed to use an image reversal method, whereby it becomes possible to use a posi-resist film to form a pattern of protrusions on a stamper surface without utilizing a mask, i.e. by scanning the stamper surface by a modulated light beam as described for FIG. 3. With that photolithography method, after scanning the photoresist layer by a modulated light beam, for selective exposure, the substrate with the photoresist layer thereon is baked at a high temperature for a fixed time (that procedure being known as a reverse bake operation), to thereby produce cross-linking of molecular chains within those portions of the photoresist that have been exposed to the light beam. The entire photoresist layer is then uniformly exposed to light, i.e. is subjected to overall flood exposure, then an aqueous alkaline solution is applied to the photoresist layer, to remove only those portions which were not exposed to the modulated light beam (i.e. the portions in which molecular cross-linking has occurred have a very low degree of solubility in that alkaline solution). The desired pattern of photoresist portions is thereby left on the stamper surface. It can be understood that with such a method, the scanning and reverse bake operation provide the same effect as if a mask had been placed over the photoresist layer at the start of the process, and light were then directed overall through the mask onto the layer.

Previously, such a method has been limited to a pattern resolution of approximately 0.6 µm. However as a result of advances which have been made since the time at which that method of using a posi-resist material was proposed, it has become possible by optimization of the process to obtain a photolithography pattern resolution of less than 0.6 µm, and it is now possible achieve a resolution of approximately 0.15 µm.

The present invention utilizes such a method of photolithography, employing a short wavelength of laser light for exposing the posi-resist, with the light being focussed to a spot size of approximately 0.5 µm diameter.

Figures 2, 4:
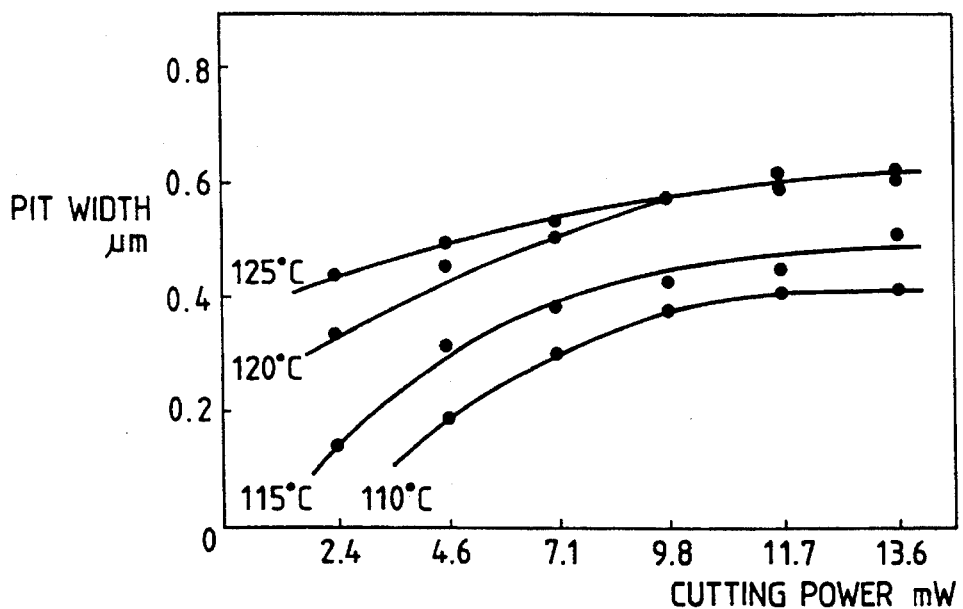
FIG. 2 is a graph showing a relationship between values of pit width obtained for a stamper and values of laser cutting power and reverse bake temperature that are used in a photolithography process in manufacturing a stamper according to the present invention.
FIG. 4 is a table for comparing results obtained with high-density recording disks manufactured using the first and second embodiments of a stamper according to the present invention, with a recording disk having a pit width of 0.6 µm.
Figure 3A:
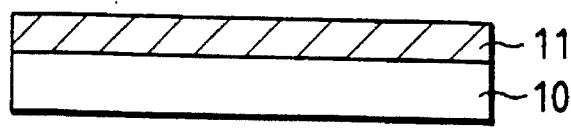
FIG. 3 is a diagram showing successive steps in each of a first and a second embodiment of a method of manufacture of a stamper according to the present invention.
Figure 3B:
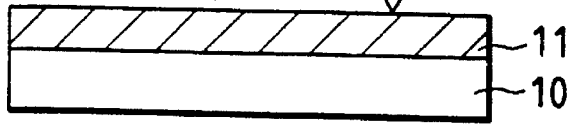
Figure 3C:
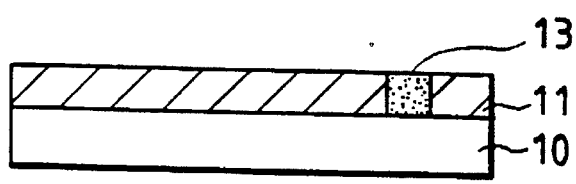
Figure 3D:
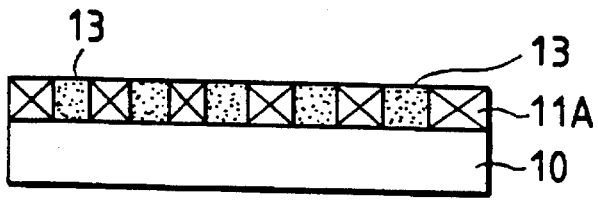
Figure 3E:
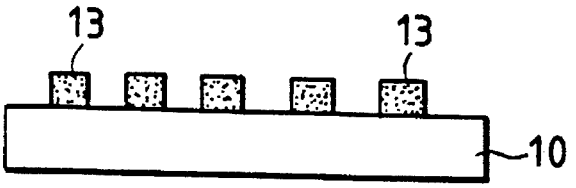
Figure 3F:
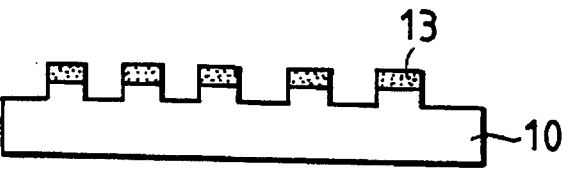
Figure 3G:
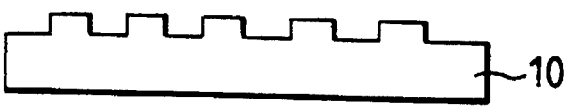

FIG. 2 shows graphs to illustrate the results obtainable by the method of the present invention, using the above conditions for the exposure light beam, showing values of pit width obtained, with laser beam cutting power and the reverse bake temperature as variable parameters. More specifically, the conditions are:

Laser light wavelength: 413 nm;
Numerical aperture (N.A.) of focussing lens: 0.94;
Type of photoresist: AZ5206E, manufactured by Hoechst Japan, Ltd.

As shown, the higher the reverse bake temperature, the greater becomes the pit width. Furthermore as the level of cutting power of the laser light beam is increased, the pit width is increased. It can be understood that the pit width can be adjusted to a required value by altering at least one of the two variable parameters, i.e. reverse bake temperature and light beam cutting power. The minimum pit width obtainable was found to be 0.15 µm.

A first embodiment of a method of manufacture of a stamper according to the present invention will be described referring to FIG. 3, in which diagrams (a) to (g) show successive steps in the manufacturing process for producing a stamper to be used in manufacturing high-density recording disks. Firstly as shown in diagram (a), a positive type of photoresist (the AZ5206E photoresist manufactured by Hoechst Japan Ltd.) is formed as a thin film 11 over an upper surface of a highly polished quartz glass substrate 10, with the photoresist being evenly coated to a thickness of 1000 angstroms. The coated substrate is then subjected to pre-baking for 30 minutes at a temperature of 90° C. Next, as shown in diagram (b), the photoresist layer 11 is selectively exposed to light, by a modulated laser light beam 12 emitted by a Kr laser, with a light wavelength of 413 nm, with the light being focussed by a lens having numerical aperture (N.A.) of 0.94 and with the laser power being 4.6 mW. Next, the structure is baked for five minutes at a temperature of 115° C., as the reverse bake process, to thereby produce linkage of molecular chains within the portions 13 of the photoresist 11 which have been exposed to the light beam, as indicated in diagram (c). Next, the photoresist layer is subjected to overall flood exposure to ultra-violet (UV) light, so that portions 11a of the photoresist which were not exposed to the laser light beam are thereby made soluble in an aqueous alkaline solution (diagram (d)). The structure is then developed in such a solution for 30 seconds, leaving a pattern of upwardly protruding portions 13 of photoresist disposed over the upper surface of the substrate 10 as shown in diagram (e). Dry etching of that upper surface is then executed to a desired depth, using the pattern of upwardly protruding portions 13 as a mask, under conditions of 6×10$^{-2}$ Torr (using CHF$_3$ gas), and 200 W (diagram (f)). The remaining portions of the photoresist are then removed, and the desired completed stamper is thereby obtained, as shown in diagram (g).

Stampers manufactured by the process described above have been evaluated using a highly precise surface measurement apparatus and a scanning electron microscope. It was found that a glass stamper having a protrusion width (i.e. pit width) of 0.3 m and a stamper protrusion height of 850 angstroms can be manufactured.

A second embodiment of a method of manufacture of a stamper according to the present invention will now be described. In this embodiment, the laser power level was 2.4 mW, however in all other respects the method of manufacture is identical to that of the first embodiment described above. Using the same apparatus for evaluating this embodiment as were used to evaluate the first embodiment, it was found that a glass stamper can be produced having a protrusion width (pit width) of 0.15 µm and a protrusion height of 850 angstroms.

As described in the above, by using a positive type of photoresist layer in conjunction with image reversal processing, the invention makes it possible to manufacture a stamper formed of glass, having a width of less than 0.6 µm for the stamper protrusions, which has not been possible in the prior art. The width of the stamper protrusions (and hence the pit width of a pattern formed in a recording disk manufactured using such a stamper) can be selected to be within the range 0.15 to 0.6 µm by adjusting either the light beam cutting power or the reverse bake temperature, or both of these parameters.

FIG. 4 is a table for comparing results obtained for optical recording disks manufactured by using stampers produced by the methods of the the first and second embodiments of the present invention, having a pit width of less than 0.6 µm, with an optical recording disk (CD) having a pit width of 0.6 µm. As can be understood from FIG. 4, the smaller the pit width, (and hence the smaller the average pit length), the greater becomes the number of pits which can be formed along the recording track direction, while in addition the track pitch can be reduced. As a result, a very substantial increase in recording density can be achieved. If for example the pit width is reduced from 0.6 µm to 0.3 µm, then the recording capacity of the recording disk is increased by four times. If the pit width is further halved, i.e. reduced to 0.15 µm, then the recording capacity is again increased by four times, i.e. is increased by 16 times by comparison with a recording disk having a pit width of 0.6 µm.

With the embodiments described above, a recording master stamper is produced by scanning with a modulated light beam. However it would be equally possible to form a mask, by a process that is known in semiconductor manufacturing, and to then (after forming a thin layer of posi-resist over the stamper surface) dispose the mask over the photoresist layer and then subject the mask and photoresist to overall flood exposure to light. In that case, two photolithography processes would be required, i.e. to form a patterned mask, and to form a photoresist pattern on the surface of the stamper glass. However once such a mask has been manufactured, it would thereafter be possible to use that mask to form a large number of stampers in succession, so that such a method is suitable for achieving high productivity. In such a case, of the two photolithography processing operations (for patterning the mask, and for patterning the photoresist on the stamper surface), one of the operations must utilize an image reversal photolithography process and the other must utilize a normal photolithography process (i.e. which does not involve image reversal).

With the present invention as described in the above, a stamper can be manufactured having a stamper surface with a pattern of protrusions formed thereon which is the inverse of an information signal pattern consisting of successive pits, to be used in forming high-density recording disks by transferring the information signal pattern to a layer of soft plastic material which is subsequently hardened, with the pit width of the information signal pattern being selectable to be within the range 0.6 to 0.15 µm. Due to the fact that glass is used as the material of the stamper, the stamper surface is extremely hard, and that surface can be made extremely flat, so that such a stamper is very suitable for manufacturing high-density recording disks.

What is claimed is:

1. A method of manufacturing a stamper for use in producing high-density recording disks which comprises the steps of:

coating a film of photoresist over a flat surface of a glass substrate;

scanning said photoresist film with a light beam which is modulated in accordance with an information signal pattern said light beam having a power level of less than or equal to about 13.6 mW;

executing a reverse bake operation of heating said glass substrate and photoresist film at a temperature of less than or equal to about 125° C. for a predetermined time period;

subjecting said photoresist film to overall flood exposure to light;

applying an alkaline solution to remove all portions of said photoresist film other than portions which had been exposed to said light beam, to leave a photoresist film pattern corresponding to said information signal pattern;

executing etching of said surface of the glass substrate, to form a pattern of protrusions thereon which have a pit width that is within a range of from 0.15 μm to less than 0.6 μm, using said photoresist film pattern as a mask; and removing all remaining portions of said photoresist film.

2. A method of manufacturing a stamper according to claim 1, wherein said reverse bake is conducted at a temperature within the range of about 110° C. to 125° C. and said scanning with a light beam is conducted with a light having a power level within the range of about 2.4 mW to 13.6 mW.

3. A method of manufacturing a stamper according to claim 1, wherein said etching step produces a pattern of protrusions on the glass substrate which have a pit width that is within a range of 0.15 μm to 0.5 μm.

4. A method of manufacturing a stamper according to claim 2, wherein said etching step produces a pattern of pits on the glass substrate which have a pit width that is within a range of 0.15 μm to 0.5 μm.

5. A method of manufacturing a stamper according to claim 1, wherein said scanning step was conducted using a laser light having a wavelength of 413 nm and a focusing lens having a numerical aperture of 0.94.

6. A method of manufacturing a stamper according to claim 2, wherein said scanning step was conducted using a laser light having a wavelength of 413 nm and a focusing lens having a numerical aperture of 0.94.

* * * * *